(12) United States Patent
Cho et al.

(10) Patent No.: US 7,199,634 B2
(45) Date of Patent: Apr. 3, 2007

(54) DUTY CYCLE CORRECTION CIRCUITS SUITABLE FOR USE IN DELAY-LOCKED LOOPS AND METHODS OF CORRECTING DUTY CYCLES OF PERIODIC SIGNALS

(75) Inventors: Geun-Hee Cho, Gyeonggi-do (KR); Kyu-Hyoun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/005,821

(22) Filed: Dec. 7, 2004

(65) Prior Publication Data
US 2005/0122149 A1  Jun. 9, 2005

(30) Foreign Application Priority Data
Dec. 9, 2003  (KR) .................. 10-2003-0088986

(51) Int. Cl.
*H03K 3/017* (2006.01)
(52) U.S. Cl. ..................... 327/175; 327/172
(58) Field of Classification Search ............... 327/175
See application file for complete search history.

(56) References Cited

U.S. PATENT DOCUMENTS

| 6,342,801 B1 * | 1/2002 | Shin ..................... 327/175 |
| 6,373,309 B1 * | 4/2002 | Bang .................... 327/175 |
| 6,643,790 B1 * | 11/2003 | Yu et al. ............... 713/500 |
| 6,735,669 B2 * | 5/2004 | Shin ..................... 711/106 |
| 6,882,196 B2 * | 4/2005 | Yee et al. .............. 327/175 |
| 6,963,235 B2 * | 11/2005 | Lee ..................... 327/158 |
| 2001/0029566 A1 | 10/2001 | Shin |

FOREIGN PATENT DOCUMENTS

| KR | 010037024 A | 5/2001 |
| KR | 1020030052650 A | 6/2003 |

* cited by examiner

*Primary Examiner*—Long Nguyen
*Assistant Examiner*—Ryan C. Jager
(74) *Attorney, Agent, or Firm*—Myers Bigel Sibley & Sajovec

(57) ABSTRACT

Delay-locked loop integrated circuits include a duty cycle correction circuit. This duty cycle correction circuit generates at least one output clock signal having a substantially uniform duty cycle in response to at least one input clock signal having a non-uniform duty cycle. The duty cycle correction circuit is also responsive to a standby control signal that synchronizes timing of power-saving duty cycle update operations within the duty cycle correction circuit. These update operations reset the set point of the correction circuit.

5 Claims, 10 Drawing Sheets

DUTY CYCLE CORRECTION CIRCUITS SUITABLE FOR USE IN DELAY-LOCKED LOOPS AND METHODS OF CORRECTING DUTY CYCLES OF PERIODIC SIGNALS

REFERENCE TO PRIORITY APPLICATION

This application claims priority to Korean Application Serial No. 2003-88986, filed Dec. 9, 2003, the disclosure of which is hereby incorporated herein by reference.

FIELD OF THE INVENTION

The present invention relates to integrated circuit devices and, more particularly, to integrated circuit devices that synchronize timing of clock and data signals.

BACKGROUND OF THE INVENTION

Achieving a high degree of synchronization between data signals and clocks can be a significant aspect to the reliable transmission of data between integrated circuit devices, such as integrated circuit memory devices (e.g., DRAM devices) and memory controllers that transmit data to and from the integrated circuit memory devices. To achieve such high levels of synchronization between data signals and clocks, phase-locked loop (PLL) integrated circuits and delay-locked loop (DLL) integrated circuits have been developed to synchronize the timing of internal clocks (ICLK) with external clocks (ECLK).

FIG. 1 is a timing diagram that illustrates the synchronization of data transmission under three scenarios. In the first scenario, an external clock (ECLK) having a non-uniform duty cycle is used to synchronize the receipt of data DATA by an integrated circuit device (e.g., memory controller receiving data from a DRAM device) at a single data rate (SDR). In this first scenario, the use of a rising (or falling edge) of the external clock ECLK to latch-in (i.e., capture) the received data DATA can be performed reliably because each rising edge (or falling edge) is separated from a subsequent rising edge (or falling edge) by a fixed amount of time equivalent to one full period of the external clock ECLK. Accordingly, the failure of the external clock ECLK to have a uniform duty cycle typically does not influence the reliability of data synchronization. However, in the second scenario, when the external clock ECLK is used to synchronize data capture at a dual data rate (DDR), then the non-uniform duty cycle associated with the external clock ECLK will typically operate to limit the reliability of data capture. In particular, FIG. 1 illustrates how a rising edge of the external clock ECLK is subject to a much smaller data window (F0, F1, F2, . . . ) than the falling edge of the external clock ECLK, which is subject to a larger data window (S0, S1, S2, . . . ). The presence of this smaller data window associated with the rising edges of the external clock ECLK operates to limit the maximum frequency of the external clock ECLK that may be used to reliably capture incoming data. To address these problems associated with synchronizing data at dual data rates when non-uniform duty cycle are present, a duty cycle correction circuit (DCC circuit) may be used to convert an external clock ECLK having a non-uniform duty cycle into an internal clock ICLK having a uniform duty cycle. As illustrated at the bottom of FIG. 1, the use of an internal clock ICLK having a uniform duty cycle may be used to more reliably capture incoming data by equalizing the widths of the data windows associated with the rising and falling edges of the clock (i.e., equalize F0, F1, F2, . . . with S0, S1, S2, . . . ).

FIG. 2 illustrates a block diagram of an internal clock generator 200 having an analog duty cycle correction (DCC) circuit therein. This clock generator 200 includes a delay-locked loop 210 and an analog duty cycle correction (DCC) circuit 230, as described more fully by Korean Patent Publication No. 2003-0052650. The delay-locked loop 210 is configured to generate a preliminary internal clock ICLKP from an external clock ECLK. This preliminary internal clock ICLKP may have the same non-uniform duty cycle as the external clock ECLK. The preliminary internal clock ICLKP is provided as an input to the duty cycle correction circuit 230, which generates an internal clock ICLK having a uniform duty cycle. Unfortunately, the use of an analog duty cycle correction circuit may operate to limit the performance characteristics of the clock signal generator 200 upon start-up (i.e., power up) because of inherent start-up delays (e.g., capacitor charging delays). Accordingly, notwithstanding the DCC circuit 230 of FIG. 2, there continues to be a need for improved clock generators having improved operating characteristics.

SUMMARY OF THE INVENTION

Integrated circuit devices according to embodiments of the present invention include duty cycle correction circuits that support power-saving duty cycle update operations. In particular, a duty cycle correction circuit is configured to generate at least one clock signal (e.g., ICLK, ICLKB) having a substantially uniform duty cycle in response to at least one input clock signal (e.g., CLKIN, CLKINB) having a non-uniform duty cycle and a standby control signal (e.g., STBYDCC). The standby control signal synchronizes timing of power-saving duty cycle update operations within the duty cycle correction circuit. The correction circuit also includes a control circuit, which is configured to generate the standby control signal in response to a command and the input clock signal (e.g., CLKIN). When the correction circuit is used within a dynamic random access memory (DRAM) device, the command may represent a refresh command.

In some of these embodiments of the invention, the duty cycle correction circuit includes a duty cycle correction amplifier. This amplifier is configured to generate a complementary pair of clock signals having substantially uniform duty cycles in response to a complementary pair of input clock signals having non-uniform duty cycles. The amplifier may include a plurality of differential amplifier stages having commonly connected outputs and these differential amplifier stages may all be responsive to the standby control signal. When the standby control signal is active, the correction amplifier is disabled and enters a power-saving mode of operation which enables internal updates to the correction circuit. The correction circuit may also include a duty cycle detector configured to generate a complementary pair of pump output signals (e.g., DCC1 and DCC1B) in response to the complementary pair of clock signals generated by the correction amplifier. These pump output signals may be provided as input signals to one of the differential amplifier stages within the correction amplifier.

In other embodiments of the present invention, the duty cycle correction circuit includes a duty cycle correction amplifier configured to generate a complementary pair of output clock signals having substantially uniform duty cycles in response to a complementary pair of input clock signals having non-uniform duty cycles. A duty cycle detector is also provided. This duty cycle detector is configured to generate a complementary pair of pump output signals in response to the complementary pair of output clock signals. These pump output signals are provided to a comparator, which generates a comparator output signal (e.g., DCC2). A counter is also provided. The counter is configured to generate a digital output signal (e.g., DCC3) in response to the comparator output signal and the standby control signal. This digital output signal is provided as a digital input to a digital-to-analog converter, which is configured to generate a complementary pair of analog output signals (e.g., DCC4 and DCC4B). The pump output signals and the analog output signals may be provided as feedback signals to inputs of respective stages within the duty cycle correction amplifier.

Still further embodiments of the invention include a duty cycle correction circuit configured to support a power-saving mode of operation. This power-saving mode of operation temporarily stalls periodic switching of the at least one output clock signal while a set point of the duty cycle correction circuit is updated (e.g., during a time interval when STBYDCC is active).

Figure 1:
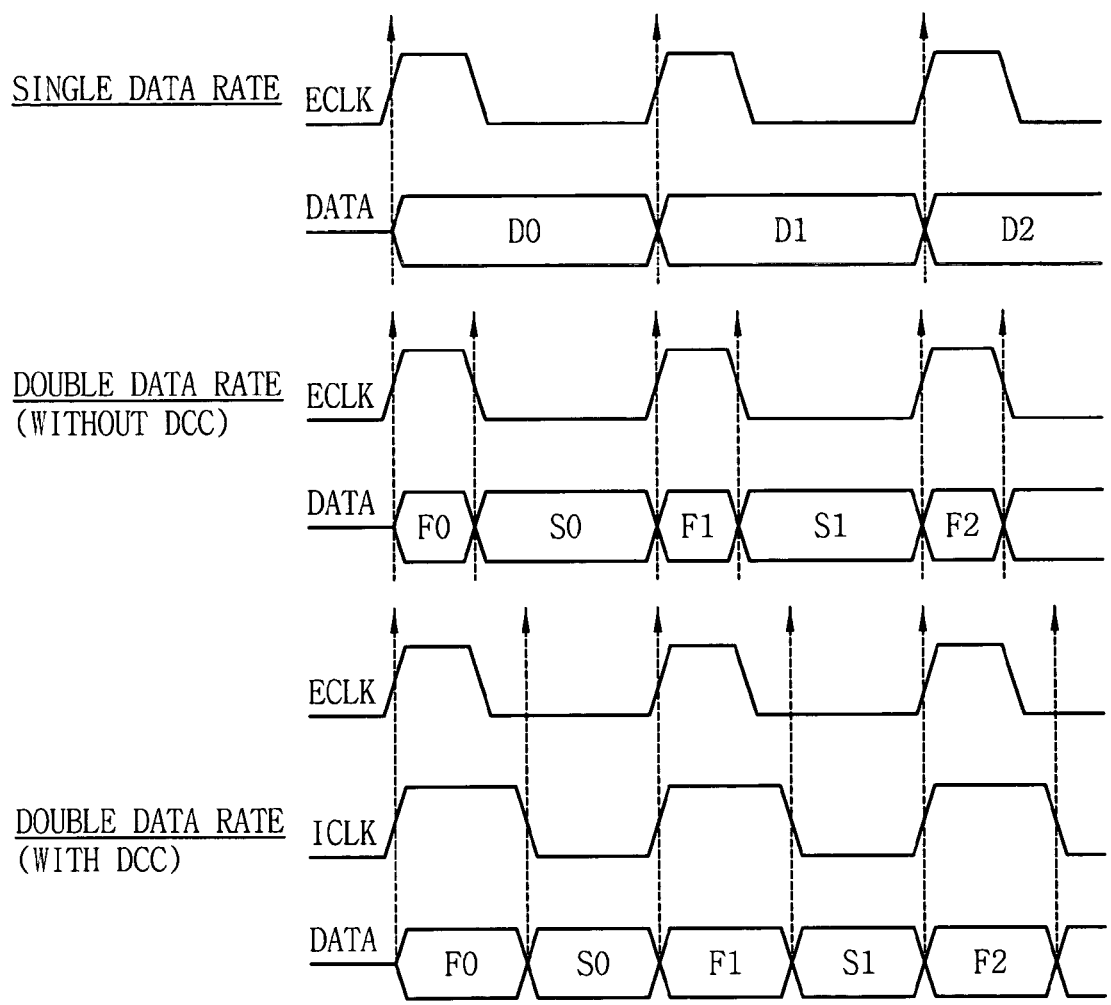
FIG. 1 is a timing diagram that illustrates conventional techniques to synchronize capture of data signals using clocks.
Figure 2:
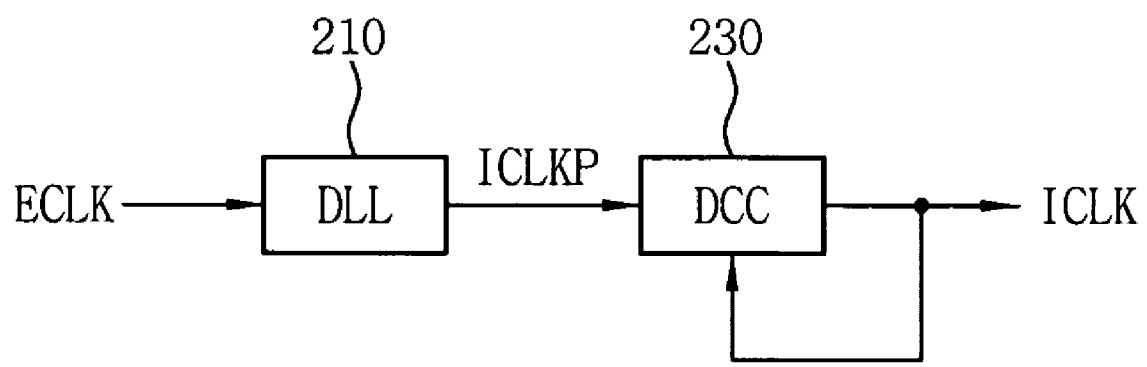
FIG. 2 is a block diagram of a conventional clock generator having an analog duty cycle correction circuit therein.

DESCRIPTION OF PREFERRED
EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 3:
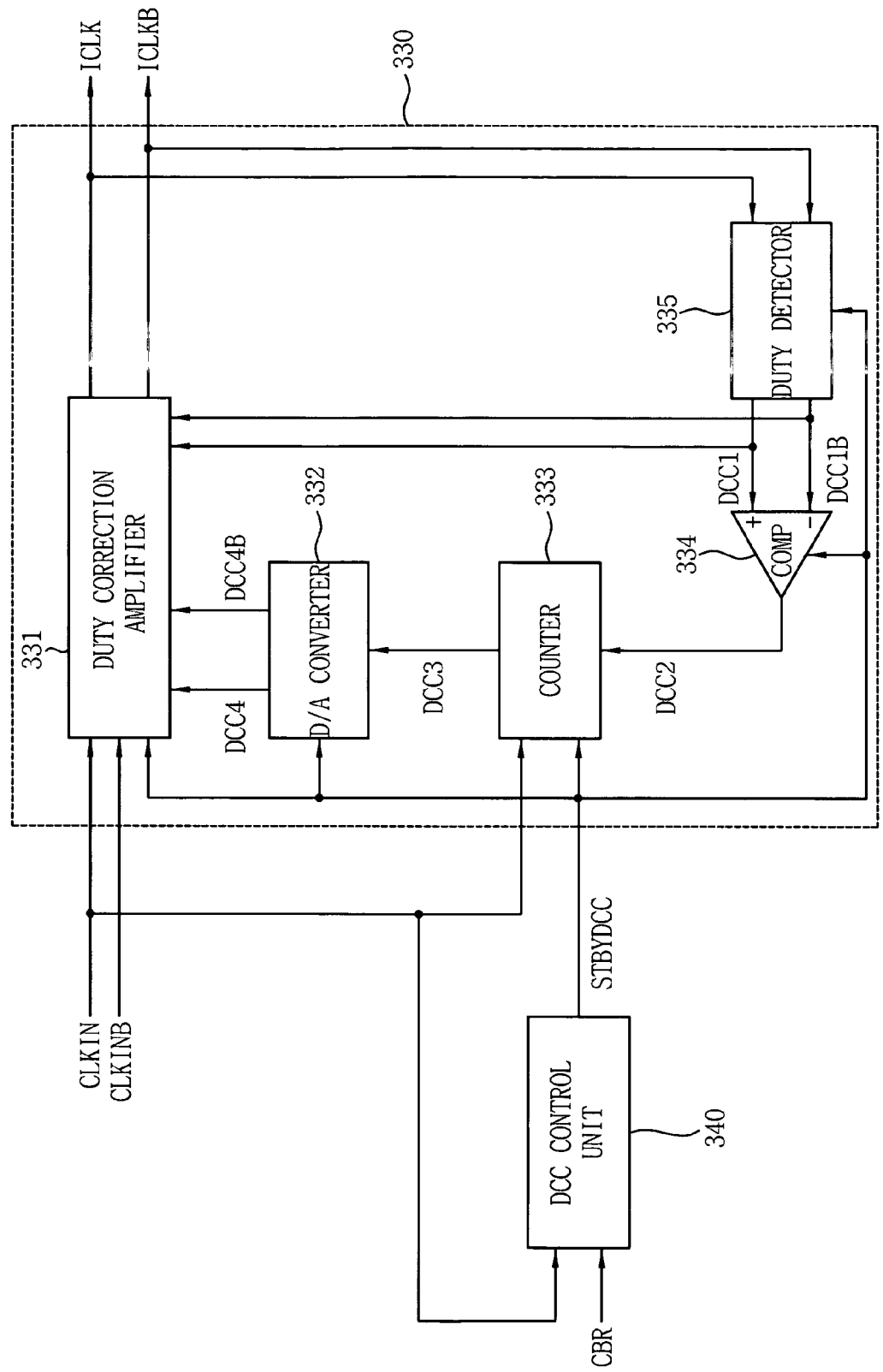
FIG. 3 is a block diagram of a duty cycle correction circuit and duty cycle control unit according to an embodiment of the present invention.

Referring now to FIG. 3, a duty cycle correction circuit 330 according to an embodiment of the invention includes a duty cycle correction amplifier 331, a duty cycle detector 335, a comparator 334, a counter 333 and a digital-to-analog converter 332. The duty cycle correction circuit 330 generates a complementary pair of internal clock signals ICLK and ICLKB and is responsive to a complementary pair of input clock signals CLKIN and CLKINB and a standby control signal STBYDCC. These internal clock signals ICLK and ICLKB may represent a pair of clock signals received by internal integrated circuit elements (i.e., circuit elements on the same chip as the correction circuit 330), and may also be treated herein as "output" clock signals generated at outputs of the correction circuit 330. The standby control signal STBYDCC operates to disable the duty cycle correction circuit 330 when active at a low logic level. This standby control signal STBYDCC is generated by a control unit 340, which is responsive to a command and a true input clock signal CLKIN. The command may be a refresh command CBR ("CAS before RAS") when the duty cycle correction circuit 330 is used in a dynamic random access memory (DRAM) device, however, other commands generated in other applications may also be used.

Figure 5:
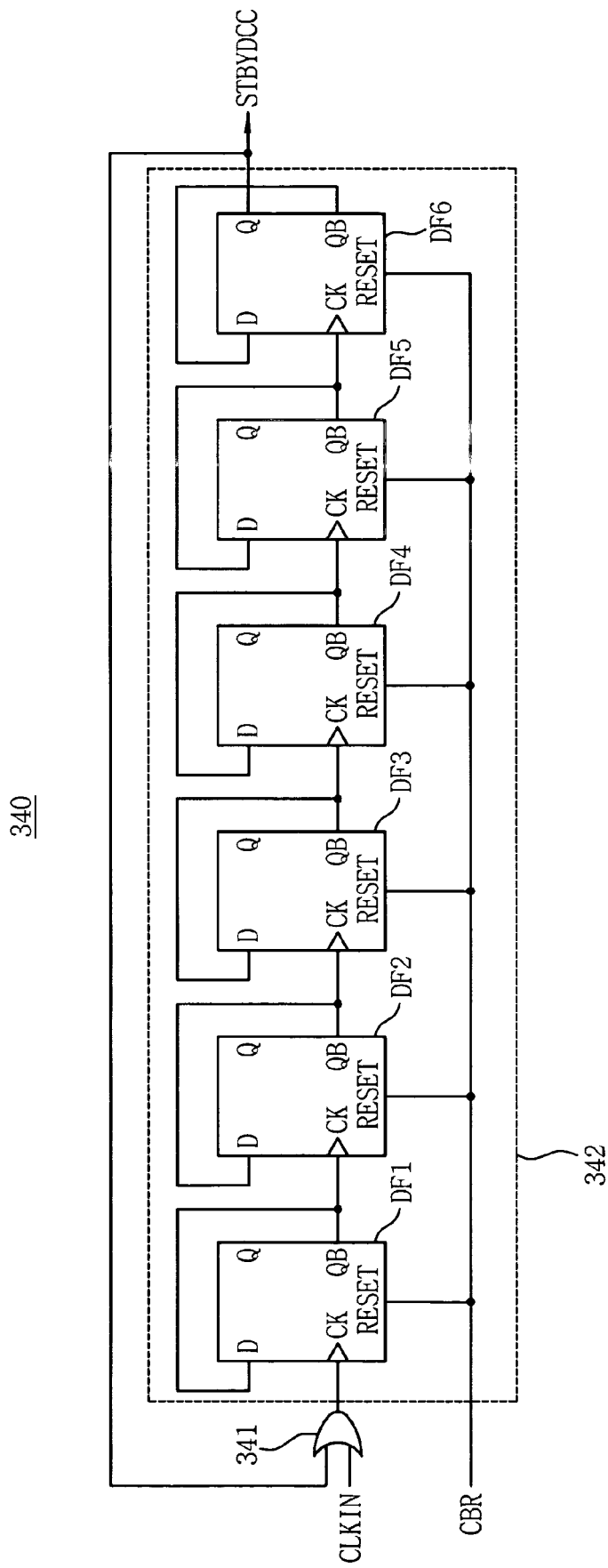
FIG. 5 is an electrical schematic of a frequency divider that may be used in the duty cycle correction control unit illustrated by FIG. 3.

As illustrated by FIG. 5, the control unit 340 includes a frequency divider 342 that is synchronized with the true input clock signal CLKIN. The frequency divider 342 is illustrated as containing six stages of D-type flip-flops that collectively perform a divide-by-$2^6$ operation on the true input clock signal CLKIN. In particular, the receipt of an active refresh command (i.e., CBR=1) will cause the flip-flops in the frequency divider 342 to be reset and the standby control signal STBYDCC to switch high-to-low. While the standby control signal STBYDCC is held low, an input OR gate operates to pass the true input clock signal CLKIN to a clock terminal of a first one of the six flip-flop stages. When this occurs, the frequency divider 342 performs a count of $2^6=64$ clock cycles before switching the standby control signal STBYDCC low-to-high. This high status of the standby control signal STBYDCC is fed back to an input of the OR gate to thereby disable further counting of the frequency divider 342. Stated alternatively, the receipt of an active refresh command CBR causes the control unit 340 to generate an active low standby control signal STBYDCC for a count of 64 cycles of the true input clock signal CLKIN. During this standby period, the duty cycle correction circuit 330 is disabled from normal operation while internal update operations are performed therein.

Figure 8:
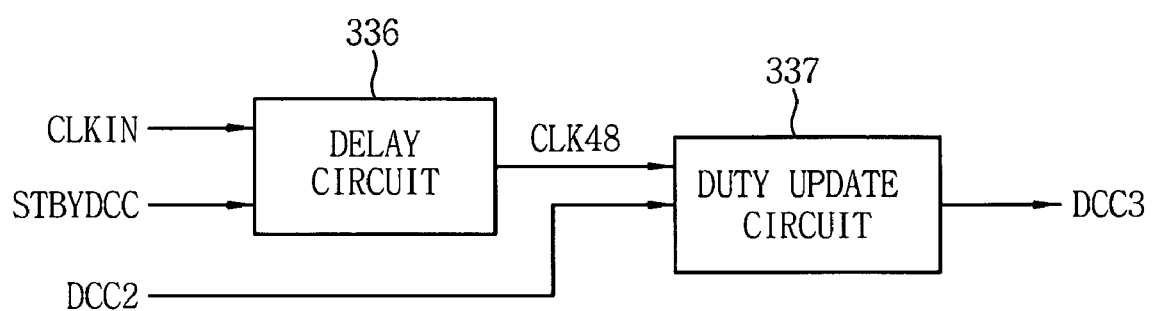
FIG. 8 is a block diagram of a counter that may be used in the duty cycle correction circuit of FIG. 3.

The counter 333 of FIGS. 3 and 8 is also configured to support the standby mode of operation for at least a portion of the standby period. In particular, the counter 333 includes a delay circuit 336 and a duty cycle update circuit 337, which generates a digital output signal DCC3 in response to a comparator output signal DCC2. This digital output signal DCC3 may be a pulse train (e.g., 1110 . . . 00011010 . . . ), which is provided as an input to the digital-to-analog converter 332. The delay circuit 336 generates a clock signal CLK48 in response to the true input clock signal CLKIN and the standby control signal STBYDCC. In particular, when the standby control signal STBYDCC is switched high-to-low in response to a refresh command CBR, the delay circuit 336 delays passing the input clock signal CLKIN to its output for a predetermined delay, which is described herein as equivalent to 48 cycles of the true input clock signal CLKIN. Accordingly, when the refresh command CBR is received and the standby control signal STBYDCC is switched high-to-low, the clock signal CLK48 switches low and stays low for a period of 48 clock cycles before resuming a normal periodic sequence equivalent to the input clock signal CLKIN. In response to the clock signal CLK48 being set low, the duty cycle update circuit 337 blocks passage of any updated comparator output signal DCC2 to the signal line DDC3.

Figure 6:
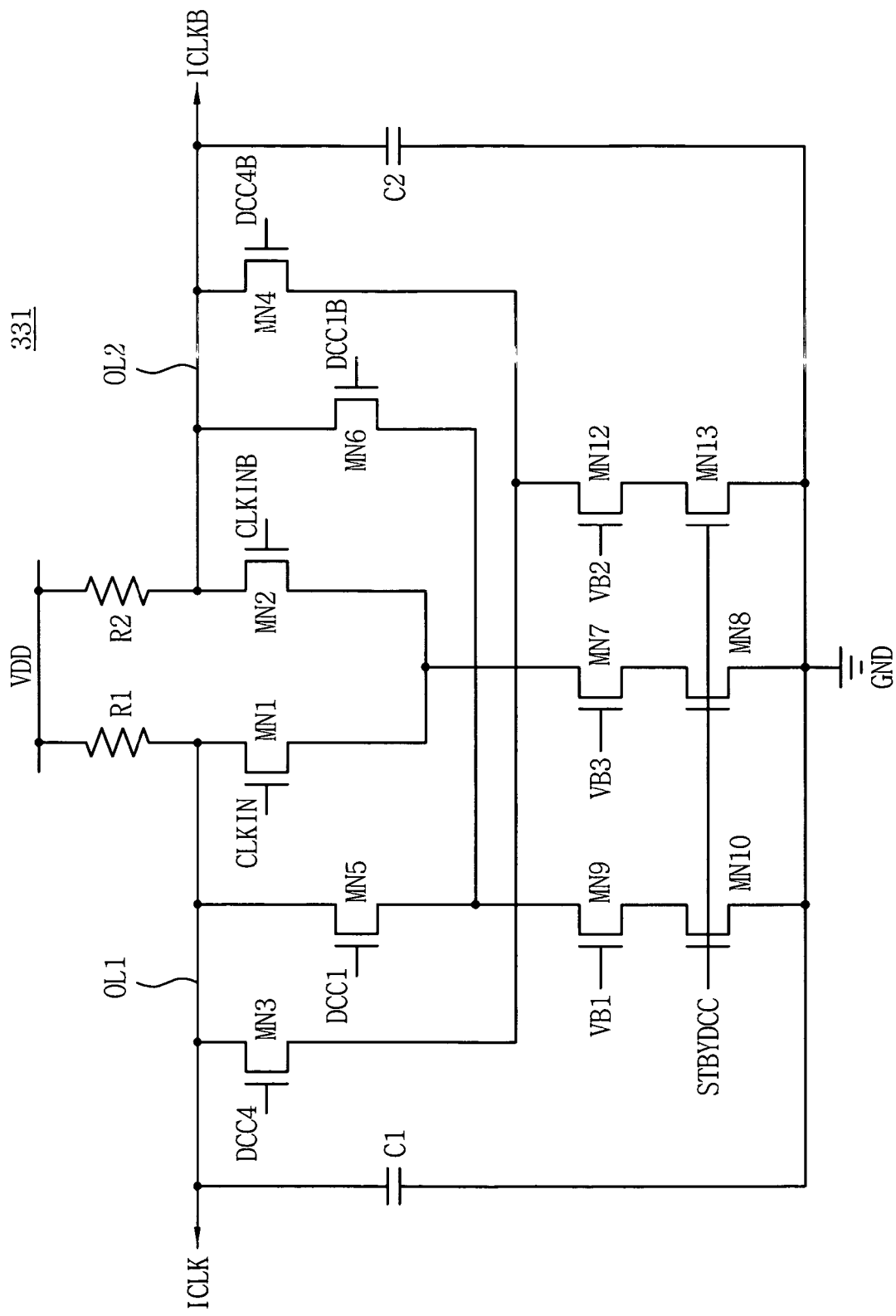
FIG. 6 is an electrical schematic of a duty cycle correction amplifier that may be used in the duty cycle correction circuit of FIG. 3.

As illustrated by FIG. 6, the duty cycle correction amplifier 331 of FIG. 3 includes three differential amplifier stages having commonly connected outputs and load elements. The first differential amplifier stage includes differential input transistors MN1 and MN2, which are responsive to the complementary pair of input clock signals CLKIN and CLKINB. This first amplifier stage also includes a current sink which is coupled to the source terminals of the differential input transistors MN1 and MN2. This current sink includes NMOS transistor MN7, which is responsive to a bias voltage VB3, in series with NMOS transistor MN8, which is responsive to the standby control signal STBYDCC. The shared load elements associated with the three stages are provided by load resistors R1 and R2, which are connected to respective ones of the output signal lines OL1 and OL2. Each of these output signal lines OL1 and OL2 is connected to a respective one of the output capacitors C1 and C2. The second differential amplifier stage includes differential input transistors MN5 and MN6, which are responsive to a complementary pair of pump output signals DCC1 and DCC1B generated by the duty cycle detector 335. This second amplifier stage also includes a current sink which is coupled to the source terminals of the differential input transistors MN5 and MN6. This current sink includes NMOS transistor MN9, which is responsive to a bias voltage VB1, in series with NMOS transistor MN10, which is responsive to the standby control signal STBYDCC. The third differential amplifier stage includes differential input transistors MN3 and MN4, which are responsive to a complementary pair of analog output signals DCC4 and DCC4B generated by the digital-to-analog converter 332. This third amplifier stage also includes a current sink which is coupled to the source terminals of the differential input transistors MN3 and MN4. This current sink includes NMOS transistor MN12, which is responsive to a bias voltage VB2, in series with NMOS transistor MN13, which is responsive to the standby control signal STBYDCC.

Accordingly, based on this configuration of the duty cycle correction amplifier 331, any transition of the standby control signal STBYDCC from high-to-low upon commencement of the standby time interval will cause the amplifier 331 to enter a power-reduced standby mode that disables all three current sinks. Upon disabling the current sinks, the output signal lines OL1 and OL2 will be pulled high to logic 1 levels (i.e., Vdd) and the complementary pair of internal clock signals ICLK and ICLKB will cease their periodic sequence.

Figure 4:
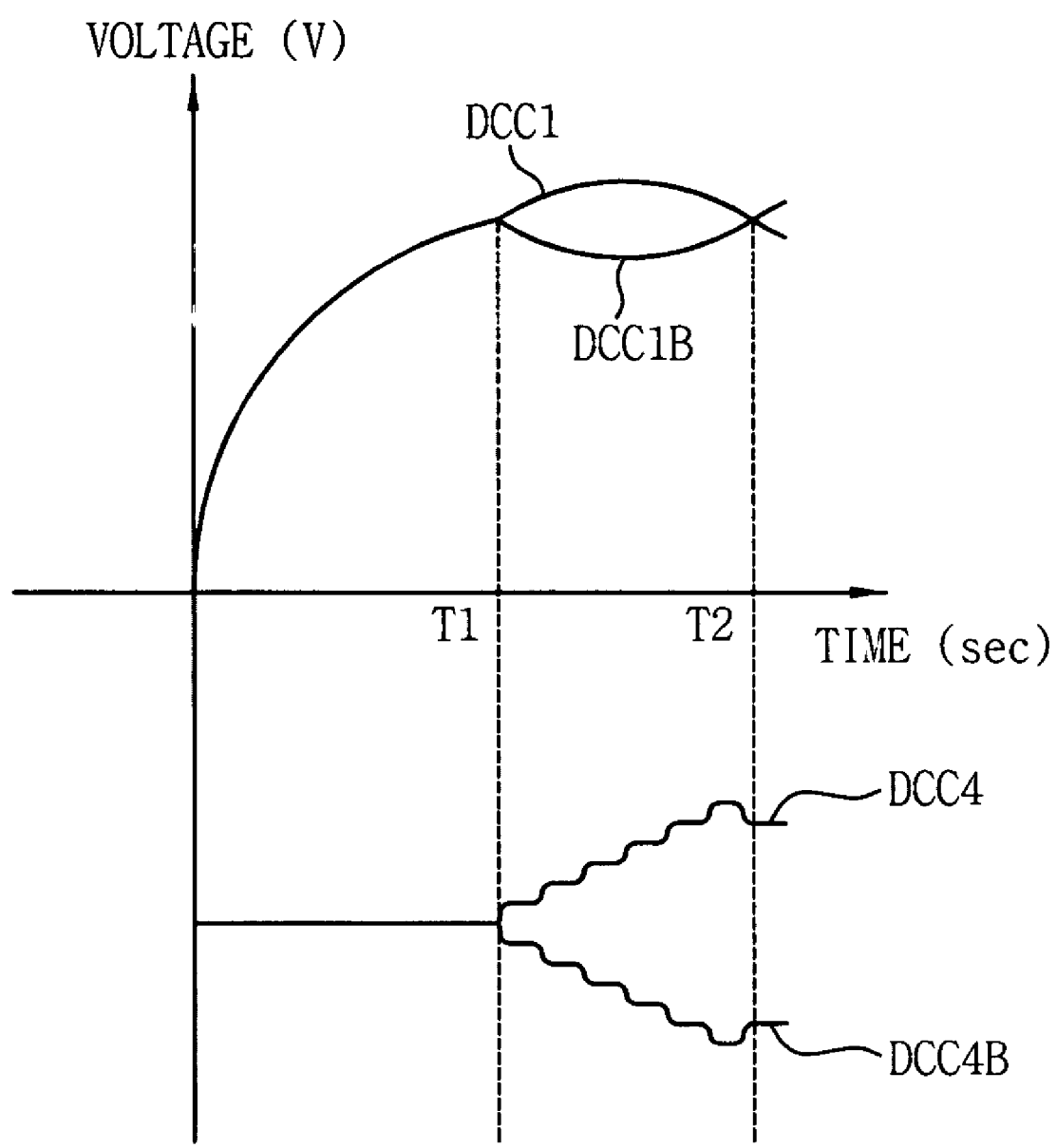
FIG. 4 is a timing diagram that illustrates operation of the duty cycle correction circuit of FIG. 3 during and after a standby mode of operation has been entered in response to a command.
Figure 7:
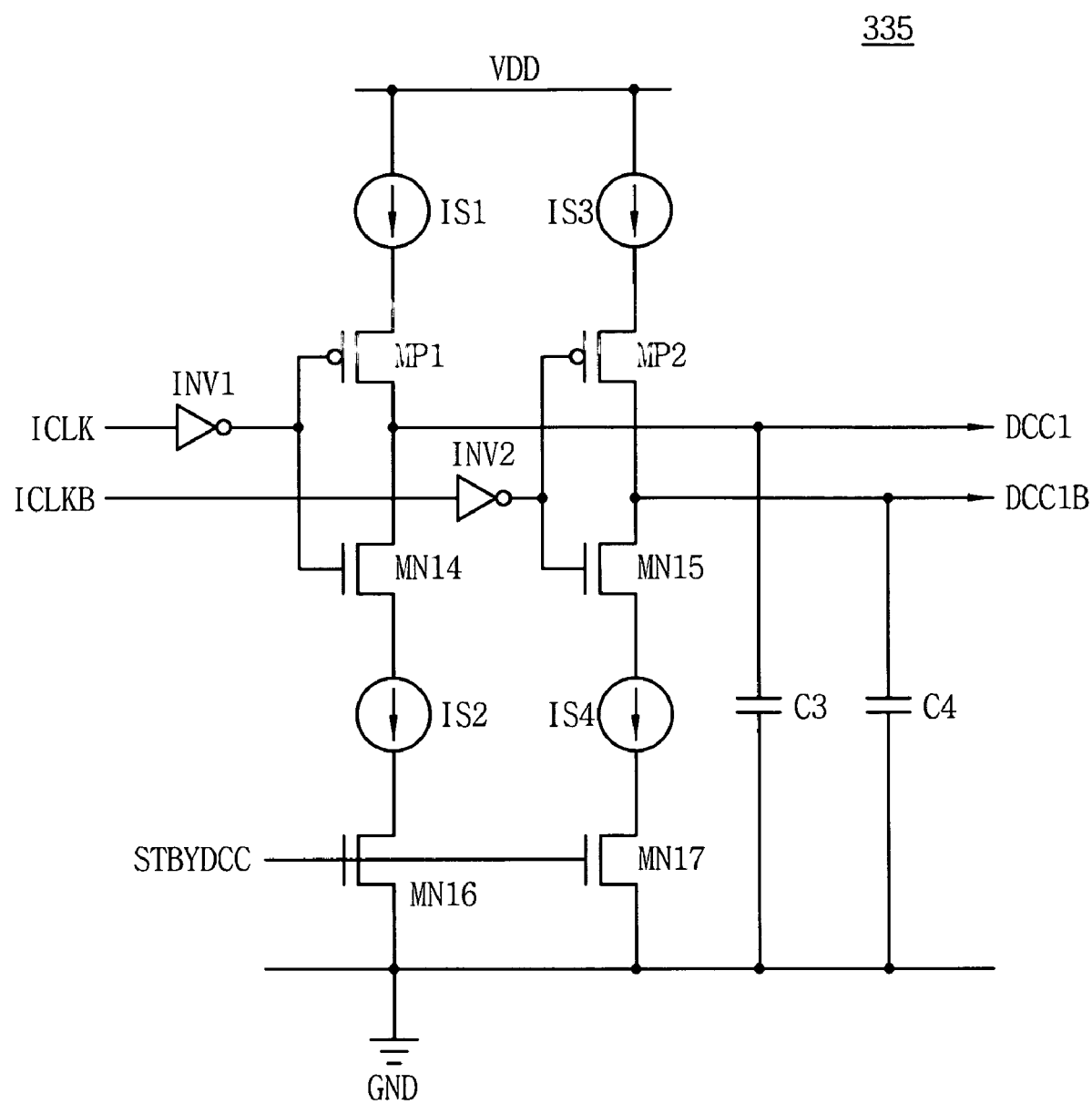
FIG. 7 is an electrical schematic of a duty cycle detector that may be used in the duty cycle correction circuit of FIG. 3.

As will now be described with respect to FIGS. 4 and 7, pulling the output signal lines OL1 and OL2 high in response to a high-to-low transition of the standby control signal STBYDCC will operate to reset the duty cycle detector 335 as well. This duty cycle detector 335 is illustrated as generating the complementary pair of pump output signals DCC1 and DCC1B in response to the complementary pair of internal clock signals ICLK and ICLKB and the standby control signal STBYDCC. The duty cycle detector 335 includes inverters INV1 and INV2, which are responsive to the complementary pair of internal clock signals ICLK and ICLKB, a pair of supply side current sources IS1 and IS3 and a pair of current sinks IS2 and IS4, connected as illustrated. The duty cycle detector 335 also includes PMOS pull-up transistors MP1 and MP2, NMOS pull-down transistors MN14 and MN15, and NMOS enable/disable transistors MN16 and MN17.

The transition of the standby control signal STBYDCC from high-to-low causes the enable/disable transistors MN16 and MN17 to turn off and causes the clock inputs ICLK and ICLKB to both be pulled high. In response, the PMOS pull-up transistors MP1 and MP2 turn on and NMOS pull-down transistors MN14 and MN15 turn off. Turning PMOS pull-up transistors MP1 and MP2 on simultaneously causes the pump output signals DCC1 and DCC1B to be pulled high as the output capacitors C3 and C4 are simultaneously charged. As illustrated by FIG. 4, the simultaneous charging of the pump output signals DCC1 and DCC1B occurs during the time interval from 0 to time point T1 as a new set point of the correction circuit is established. During this time interval, the analog output signals DCC4 and DCC4B are held at fixed voltage levels while the digital-to-analog converter 332, which is responsive to the standby control signal STBYDCC, operates in a standby mode of operation. As described above with respect to FIG. 5, the duration during which the standby control signal STBYDCC remains low in response to an active command signal CBR is equivalent to 64 clock cycles. Thereafter, during the time interval from time point T1 to time point T2, the duty cycle correction circuit 330 resumes normal operation and begins generating a pair of periodic internal clock signals ICLK and ICLKB having updated duty cycles. If these duty cycles are unequal, then the pump output signals DCC1 and DCC1B will begin to increase or decrease in opposite directions. Thus, during the time interval from T1 to T2, the voltage level of the pump output signal DCC1 may increase as the voltage level of the pump output signal DCC1B decreases. The comparator 334 operates to detect this variation in the relative levels of the pump output signals DCC1 and DCC1B by changing the value of the comparator output signal DCC2. The counter 333 generates the digital output signal DCC3 (e.g., pulse train) which is synchronized with the true input clock signal CLKIN. This synchronized generation of the digital output signal DCC3, which has a logic 1 or logic 0 level during each period of the true input clock signal CLKIN, is used by the digital-to-analog converter 332 to generate a pair of analog output signals DCC4 and DCC4B. As illustrated by the timing diagram of FIG. 4, whenever the pump output signal DCC1 is greater than the pump output signal DCC1B, the analog output signal DCC4 will incrementally increase in value (in-sync with the true input clock signal CLKIN) and the complementary output signal DCC4B will incrementally decrease in value. The reverse is true whenever the pump output signal DCC1 is less than the pump output signal DCC1B.

Referring again to FIGS. 4 and 6, these illustrated changes in the values of the pump output signals DCC1 and DCC1B and the analog output signals DCC4 and DCC4B alter the conductivity of the input transistors MN3/MN4 and MN5/MN6 within the duty cycle correction amplifier 331. Changing the conductivity of these input transistors causes the duty cycle of one of the internal clock signals (ICLK or ICLKB) to increase and the duty cycle of the other internal clock signal (ICLKB or ICLK) to decrease. This adjustment in the duty cycle of the internal clock signals ICLK and ICLKB is reflected in new values of the pump output signals DCC1 and DCC1B and the analog output signals DCC4 and DCC4B, which provide a form of corrective feedback that operates to at least substantially equilibrate the duty cycles of the internal clock signals ICLK and ICLKB (i.e., achieve 50:50 duty cycles).

Figure 9:
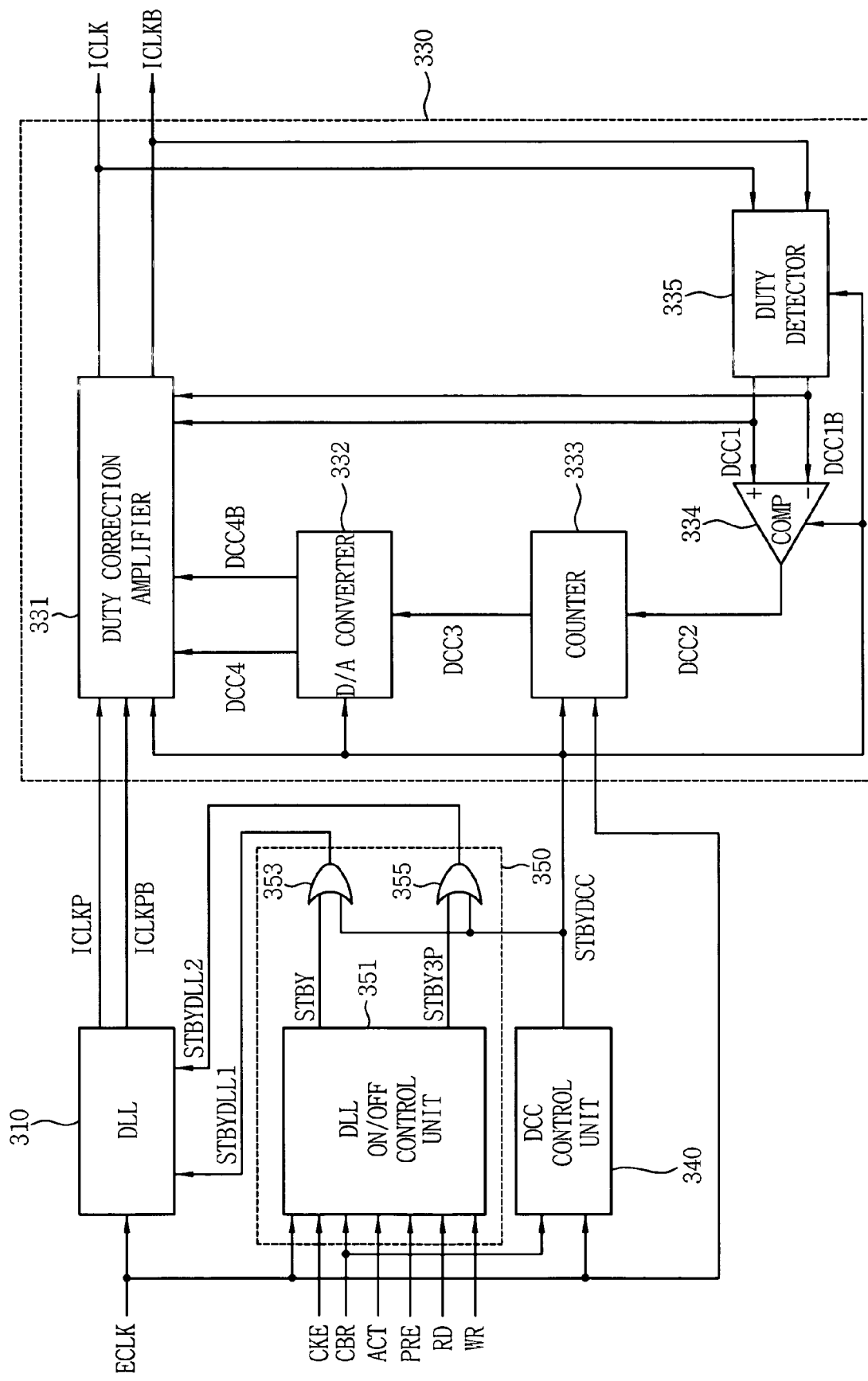
FIG. 9 is a block diagram of a clock generating circuit according to an embodiment of the present invention.

Referring now to FIG. 9, a clock generating circuit according to an embodiment of the invention includes the duty cycle correction circuit 330 and the control unit 340 of FIG. 3 in addition to a delay-locked loop (DLL) integrated circuit 310 and a DLL control unit 350. The DLL integrated circuit 310 is illustrated as generating a complementary pair of preliminary internal clock signals ICLKP and ICLKPB in response to an external clock signal ECLK, which may have a non-uniform duty cycle. The DLL integrated circuit 310 operates to lock the frequency and phase of the preliminary internal clock signal ICLKP to the frequency and phase of the external clock signal ECLK, with the other preliminary internal clock signal ICLKPB being complementary to the clock signal ICLKP. The DLL integrated circuit 310 is also responsive to a pair of DLL standby signals STBYDLL1 and STBYDLL2. When active, the first DLL standby signal STBYDLL1 operates to dispose the DLL integrated circuit 310 in a power-off mode of operation, which disables operation of the DLL integrated circuit 310. In contrast, when active, the second DLL standby signal STBYDLL2 operates to dispose the DLL integrated circuit 310 in a power saving mode of operation, which disables operation of some (but not all) of the elements within the DLL integrated circuit 310.

The DLL control unit 350 includes an on/off control unit 351 and a pair of OR gates 353 and 355. The on/off control unit 351 is responsive to the external clock ECLK, a power down signal CKE and the following commands: refresh CBR, active ACT, precharge PRE, read RD and write WR. The on/off control unit 351 is also configured to generate a pair of standby signals: STBY and STBY3P. The OR gate 353 generates the first DLL standby signal STBYDLL1 at an active low level when the following input conditions are met: STBY=STBYDCC=0. Likewise, the OR gate 355 generates the second DLL standby signal STBYDLL2 at an active low level when the following input conditions are met: STBY3P=STBYDCC=0. Accordingly, the generation of an active low standby control signal STBYDCC enables both OR gates 353 and 355 to pass the corresponding standby signals STBY and STBY3P to the signal lines STBYDLL1 and STBYDLL2.

Figure 10:
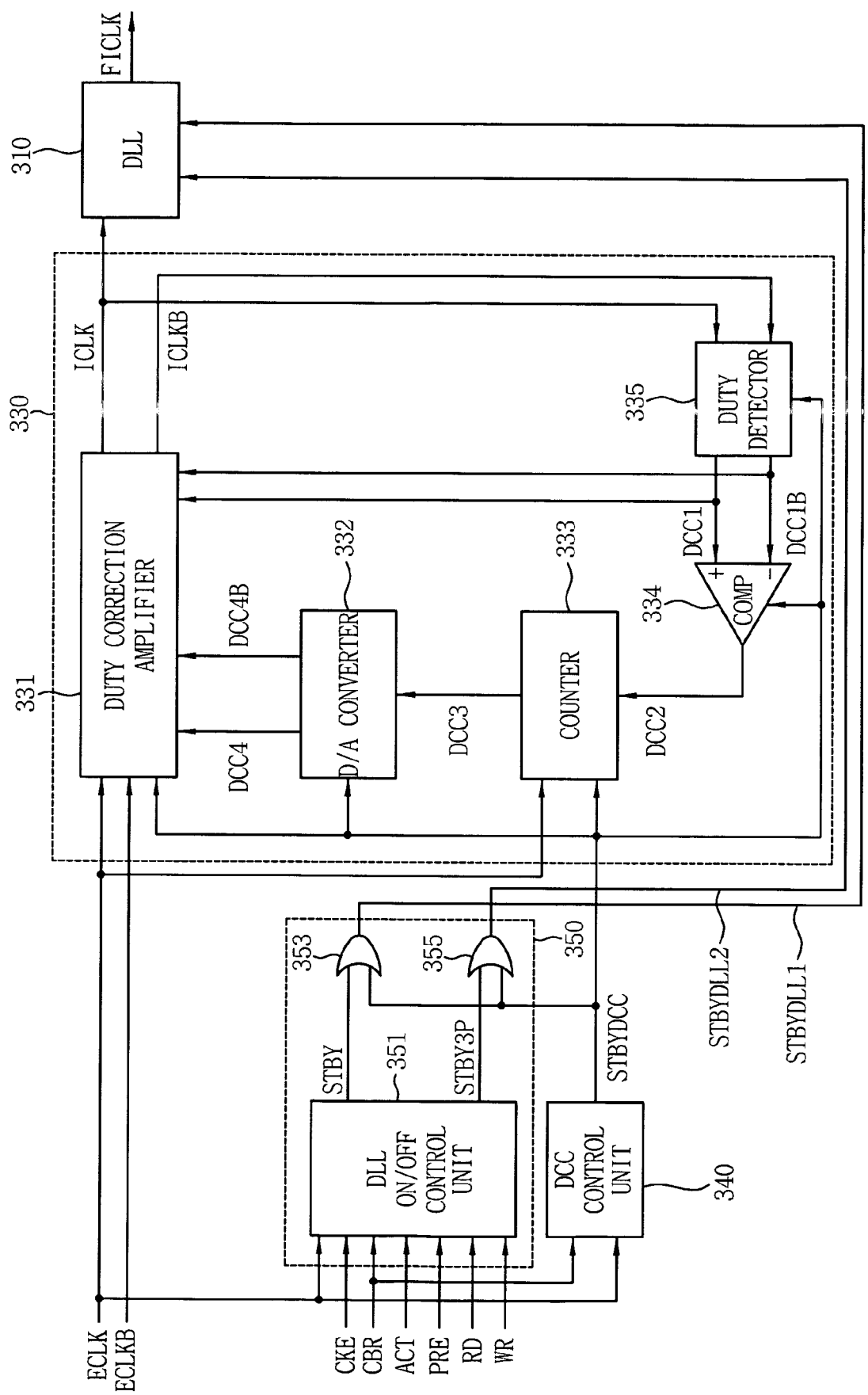
FIG. 10 is a block diagram of a clock generating circuit according to another embodiment of the present invention.

Referring now to FIG. 10, a clock generating circuit according to another embodiment of the invention is illustrated. This clock generating circuit is similar to the clock generating circuit of FIG. 9, however, the delay-locked loop (DLL) integrated circuit 310 is shown as being configured to receive the true input clock signal ICLK at the output of the duty cycle correction circuit 330 and the duty cycle correction circuit 330 is illustrated as receiving a complementary pair of external clock signals ECLK and ECLKB. This DLL integrated circuit 310 generates a final internal clock signal FICLK, which is phase and frequency locked to the true input clock signal ICLK having a substantially uniform duty cycle. The other elements within the clock generating circuit of FIG. 10 operate equivalently to the corresponding elements illustrated by FIGS. 3 and 9, and need not be described further herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a duty cycle correction circuit configured to generate a complementary pair of output clock signals having substantially uniform duty cycles in response to a complementary pair of input clock signals having non-uniform duty cycles and a standby control signal that synchronizes timing of power-saving duty cycle update operations within said duty cycle correction circuit, said duty cycle correction circuit comprising:
   a duty cycle correction amplifier configured to generate the complementary pair of output clock signals in response to the complementary pair of input clock signals;
   a duty cycle detector configured to generate a complementary pair of pump output signals in response to the complementary pair of output clock signals;
   a comparator configured to generate a comparator output signal in response to the complementary pair of pump output signals;
   a counter configured to generate a digital output signal in response to the comparator output signal and the standby control signal; and
   a digital-to-analog converter configured to generate a complementary pair of analog output signals in response to the digital output signal.

2. The device of claim 1, wherein said duty cycle correction circuit is responsive to the complementary pair of pump output signals and the complementary pair of analog output signals.

3. The device of claim 2, further comprising a delay-locked loop configured to generate at least one of the complementary pair of input clock signals in response to an external clock signal.

4. An integrated circuit device, comprising:
   a duty cycle correction circuit configured to generate a complementary pair of output clock signals having substantially uniform duty cycles in response to a complementary pair of input clock signals having non-uniform duty cycles and support a power-saving mode of operation that temporarily stalls periodic switching of the complementary pair of output clock signals while a set point of the duty cycle correction circuit is updated, said duty cycle correction circuit comprising:
   a duty cycle correction amplifier configured to generate the complementary pair of output clock signals in response to the complementary pair of input clock signals;
   a duty cycle detector configured to generate a complementary pair of pump output signals in response to the complementary pair of output clock signals;
   a comparator configured to generate a comparator output signal in response to the complementary pair of pump output signals;
   a counter configured to generate a digital output signal in response to the comparator output signal and a standby control signal; and
   a digital-to-analog converter configured to generate a complementary pair of analog output signals in response to the digital output signal.

5. The device of claim 4, wherein said duty cycle correction circuit is responsive to the complementary pair of pump output signals and the complementary pair of analog output signals.

* * * * *